United States Patent [19]
Kirihata et al.

[11] Patent Number: 6,140,855
[45] Date of Patent: Oct. 31, 2000

[54] DYNAMIC-LATCH-RECEIVER WITH SELF-RESET POINTER

[75] Inventors: Toshiaki Kirihata, Poughkeepsie; Gerhard Mueller, Wappingers Falls; David R. Hanson, Brewster, all of N.Y.

[73] Assignee: International Business Machines Corporation, Armonk, N.Y.

[21] Appl. No.: 09/281,461

[22] Filed: Mar. 30, 1999

[51] Int. Cl.[7] .................................................. H03K 3/356
[52] U.S. Cl. ........................... 327/200; 327/211; 327/213
[58] Field of Search .................................... 327/199, 200, 327/201, 208, 210, 211, 212, 213, 144; 326/93

[56] References Cited

U.S. PATENT DOCUMENTS

| | | | |
|---|---|---|---|
| 4,370,569 | 1/1983 | Hunsinger | 307/266 |
| 4,412,335 | 10/1983 | Froment et al. | 307/443 |
| 4,470,569 | 9/1984 | Shaffer et al. | 244/214 |
| 4,670,672 | 6/1987 | Ando et al. | 307/443 |
| 4,760,291 | 7/1988 | Nakajima et al. | 307/480 |
| 4,877,974 | 10/1989 | Kawai et al. | 307/269 |
| 5,003,194 | 3/1991 | Engelhard | 307/265 |
| 5,218,237 | 6/1993 | Mao | 307/265 |
| 5,422,585 | 6/1995 | Fan Chiangi et al. | 327/170 |
| 5,453,708 | 9/1995 | Gupta et al. | 327/211 |
| 5,517,136 | 5/1996 | Harris et al. | 326/93 |
| 5,672,990 | 9/1997 | Chaw | 327/176 |
| 5,680,265 | 10/1997 | Noguchi | 327/173 |
| 5,742,192 | 4/1998 | Banik | 327/166 |
| 5,764,083 | 6/1998 | Nguyen et al. | 326/93 |
| 5,764,089 | 6/1998 | Parvoti et al. | 327/212 |
| 5,774,005 | 6/1998 | Parvoti et al. | 327/210 |
| 5,917,355 | 6/1999 | Klass | 327/208 |
| 5,936,449 | 8/1999 | Huang | 327/211 |

*Primary Examiner*—Toan Tran
*Attorney, Agent, or Firm*—Scully, Scott, Murphy & Presser; H. Daniel Schnurmann

[57] ABSTRACT

A dynamic latch receiver device comprises a sequence of data latch devices arranged in parallel for enabling sequential latching of data signals communicated serially on a single data line. The device includes a first pointer signal generator for generating a sequence of one or more first pointer signals, each generated first pointer signal of a sequence corresponding to a specific latch device and overlapping in time with a prior generated first pointer signal of the sequence; and, a pulse converter device associated with a latch device for receiving a corresponding first pointer signal and generating a respective second pointer signal for input to a respective latch device, each second pointer signal generated in a non-overlapping sequence for triggering a respective latching of each data signal in synchronism with serially communicated data signals.

25 Claims, 8 Drawing Sheets

DYNAMIC-LATCH-RECEIVER WITH SELF-RESET POINTER

BACKGROUND OF THE INVENTION

1. Field of the Invention

The present invention relates generally to transferring and latching of data signals in computers and computing systems generally, and, particularly, to a dynamic-latch-receiver employing a self reset-pointer with a low-voltage input to result in fast and reliable voltage conversion for the latched state.

2. Discussion of the Prior Art

With rapid improvements in computer processor performance, it is not only highly desirable to have main memories with high-density, but also with higher data rates. For example, with ever-increasing system clock rates of the state-of-the-art microprocessors, high band-width DRAM's are required in order to avoid wait states without adding to the complexity of memory hierarchy, e.g., such as when implementing SRAM cache. Prefetch architectures can effectively boost the burst frequency of the DRAM data rates. For example, a "2b" prefetch architecture has been introduced for synchronous DRAM (SDRAM) to boost the data-rate to 200%. It readily follows that a "4b" prefetch architecture may be used for the double data rate SDRAM (DDR SDRAM) to boost the data-rate to 400%. An "8b" prefetch architecture is already used for the Rambus DRAM (RDRAM), realizing data rates of up to 800%.

Regardless of any prefetch architecture, a frequency conversion is required, for example, by multiplexing a plurality of data signals on a bus with slow speed for storage thereof at corresponding registers during a prefetch operation, and then reading the latched data signal sequentially from the registers to a shared bus at a high speed. A typical example of this frequency conversion is the first in first out (FIFO) circuitary comprising a plurality of registers, input pointers, and output pointers. A key design factor in FIFO circuitry is how to fetch the input data to the registers with input pointers and output the data from the registers with output pointers. Thus, there is a strong and potential requirement to design pointers for use in prefetching architecture, in particular FIFO circuitry.

FIG. 1(a) illustrates a static-latch-receiver design architecture 10 providing four input pointer signals $12a, \ldots, 12d$ for controlling four respective latch circuits $20a \ldots, 20d$. The burst data input signals $14a, \ldots, 14d$ on single data-bus 14 are serially sent to the static latch receiver 10 as a burst mode. This static-latch-receiver 10 fetches the input data when the corresponding pointer signal $12a, \ldots, 12d$ is activated (e.g., rises to logic 1). It does, however, require an input level shifter if the input voltage is different from the latched voltage, causing a speed penalty. In general, a static latch-receiver is slower than the dynamic latch-receiver as discussed hereinbelow.

FIGS. 2(a) and 2(b) illustrate a dynamic-latch-receiver architecture 30, which provides the same function provided by the static-latch-receiver architecture 10 of FIGS. 1(a) and 1(b). As shown in FIG. 2(a), the dynamic-latch-receiver architecture 30 includes latch devices $38a, \ldots, 38d$ responsive to a corresponding edge of respective pointer signals $32a, \ldots, 32d$ (FIG. 2(b)) for latching respective input data signals $14a, \ldots, 14d$ from single input line 14. This dynamic-latch-receiver architecture 30 provides the benefit of allowing input of data signals 14 having lower voltages than the latched voltage and, consequently, is faster than the static-latch-receiver. It does, however, result in a problem if a data input, e.g., signals $14a, \ldots, 14d$, is changed when the pointer signal is active, requiring a pointer signal of smaller pulse-width. In general, transferring a small pulse pointer signal globally is difficult, since the wiring carrying such global small pulse pointer signals exhibits RC low pass filter effects, which severely degrades the signal. The precharge signals $34a, \ldots, 34d$ precharges a respective latched node $38a, \ldots, 38d$ before the signal input data on serial data bus 14 is stored in the corresponding latched node $38a, \ldots, 38d$ as in a conventional dynamic logic.

It would thus be highly desirable to provide an improved circuit architecture implementing pointer signals that enable high-speed, dynamic latching of data signals carried serially on a single line to one or more latches sequentially, in a simple and efficient manner.

SUMMARY OF THE INVENTION

It is an object of the present invention to provide a dynamic latch-receiver device and control methodology for latching burst mode data signals in a manner so as to avoid the low pass filter effects of the global pointer transfer.

It is a further object of the present invention to provide a dynamic latch receiver device and control methodology that implements overlapped "global-pointer" signals for generating non-overlapped "local-pointer" signals for enabling the latching of high-speed, sequential burst data traffic on a single data line in a simple and efficient manner.

According to the principles of the invention, there is provided a dynamic latch receiver device comprising: a sequence of data latch devices arranged in parallel for enabling sequential latching of data signals communicated serially on a single data line; a first pointer signal generator for generating a sequence of one or more first pointer signals; and, a pulse converter device associated with a latch device for receiving a corresponding first pointer signal and generating a respective second pointer signal for input to a respective latch device, each said second pointer signal generated in a non-overlapping sequence for triggering a respective latching of each data signal in synchronism with serially communicated data signals.

Advantageously, the invention is suited for data prefetch and latching applications in computing system architectures implementing dynamic RAM and is capable of latching burst data at rates of, e.g., 800 Mbits/sec (corresponding to 400 MHZ double-data-rate burst cycle) or greater.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENTS OF THE INVENTION

Figure 1A:
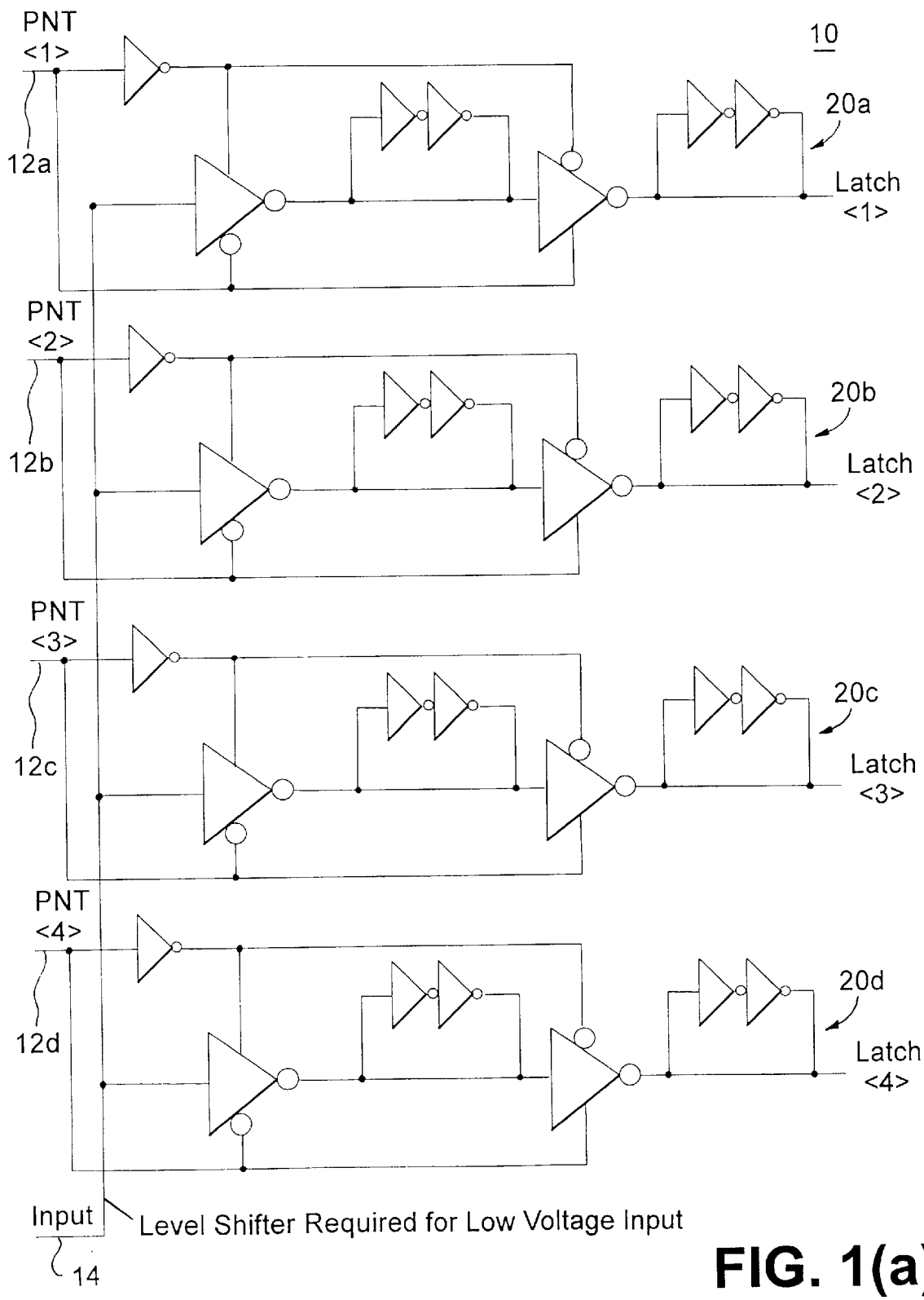
FIGS. 1(a) and 1(b) illustrates a static-latch-receiver architecture using local pointers according to the prior art.
Figure 1B:
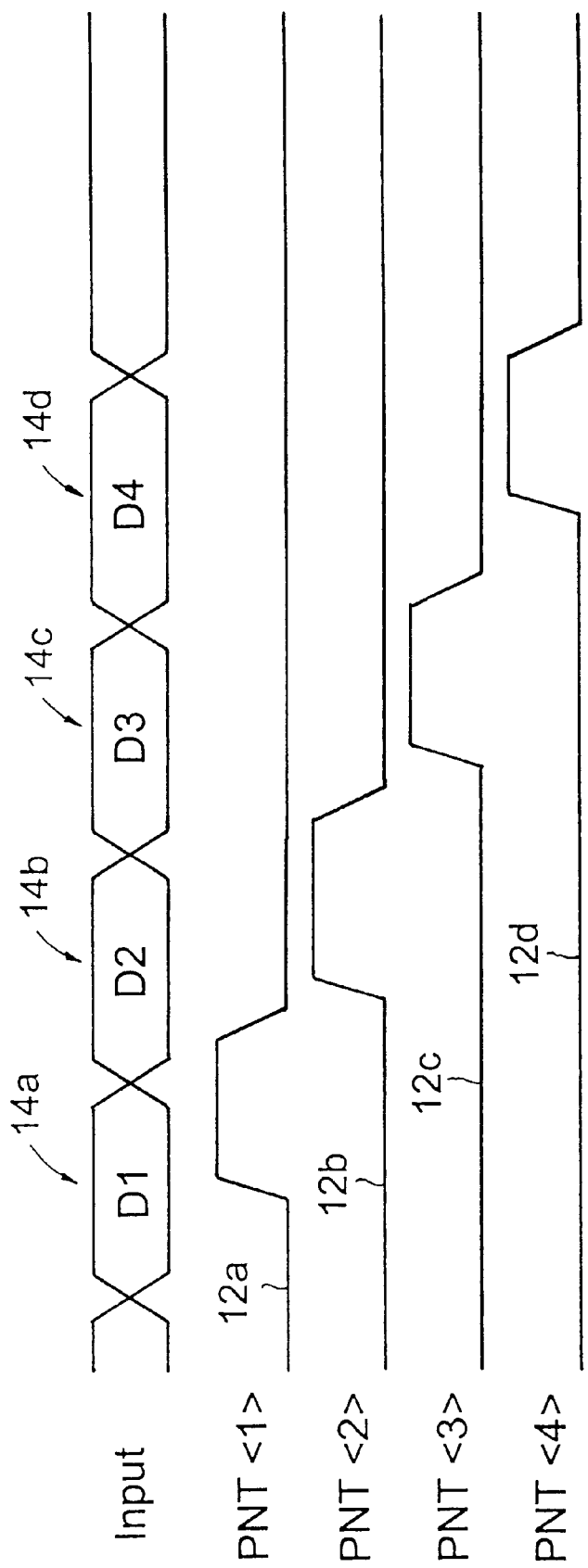
Figure 2A:
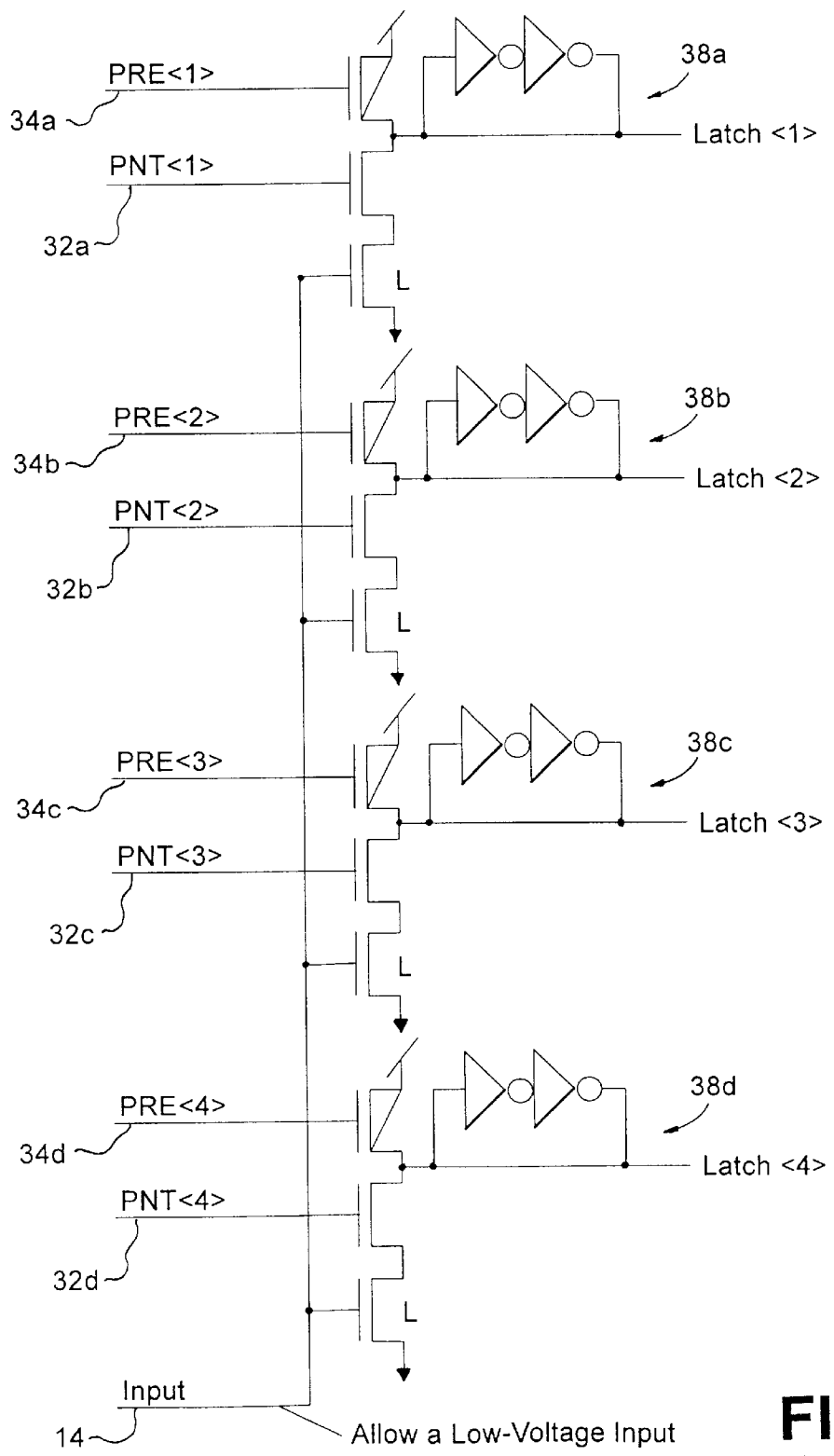
FIGS. 2(a) and 2(b) illustrates a dynamic-latch-receiver architecture using local pointers according to the prior art.
Figure 2B:
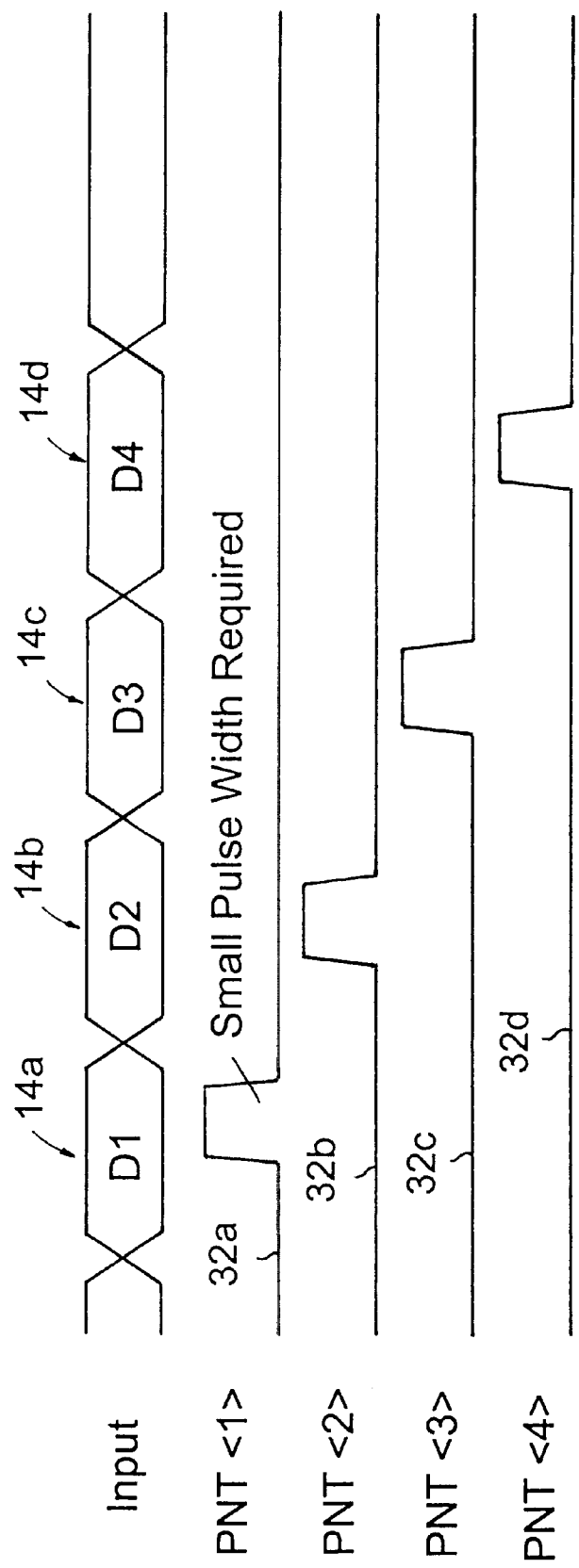
Figure 3A:
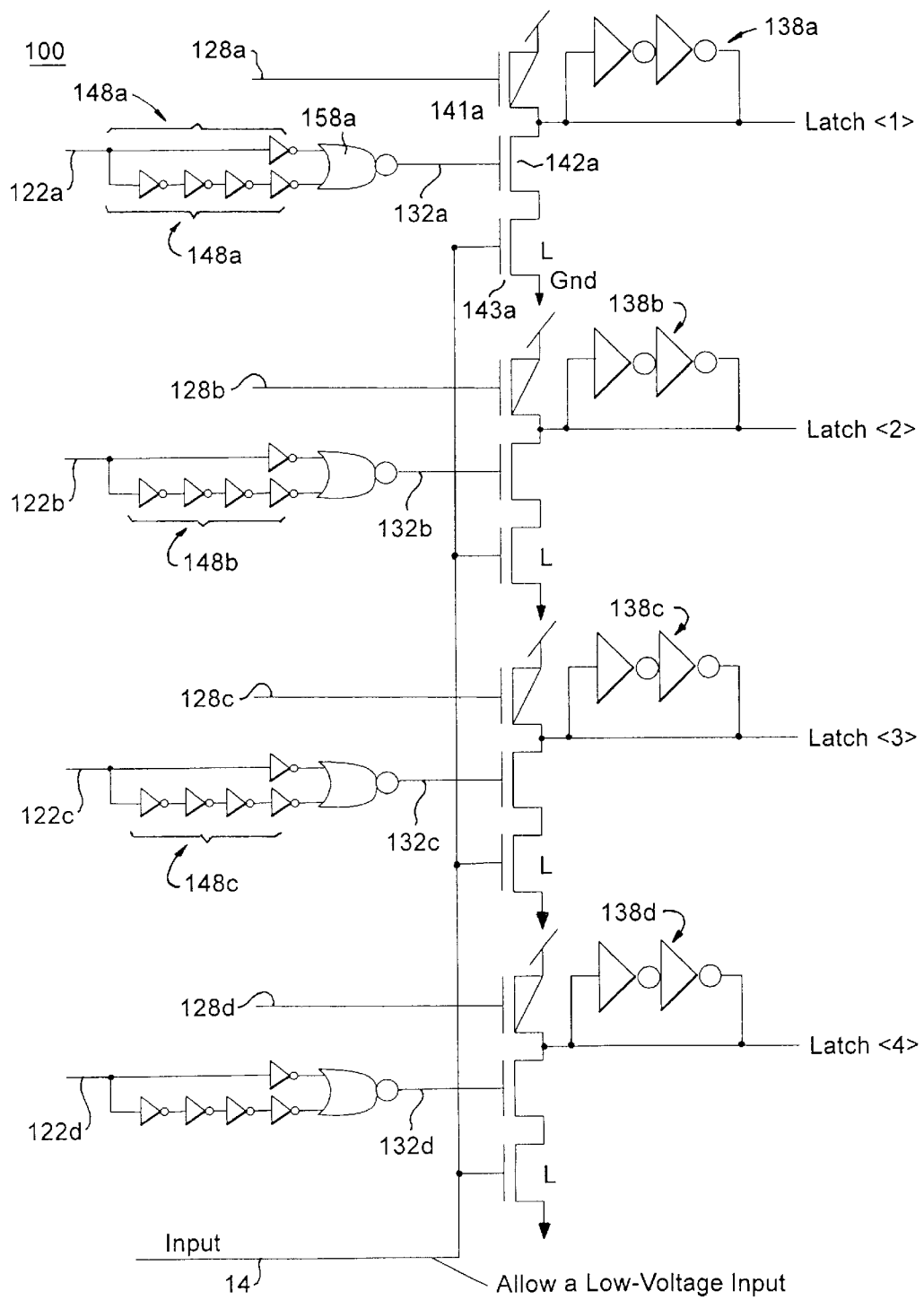
FIG. 3(a) illustrates the dynamic-latch-receiver architecture implementing s elf-reset locally generated pointer signals according to a first embodiment of the invention.
Figure 3B:
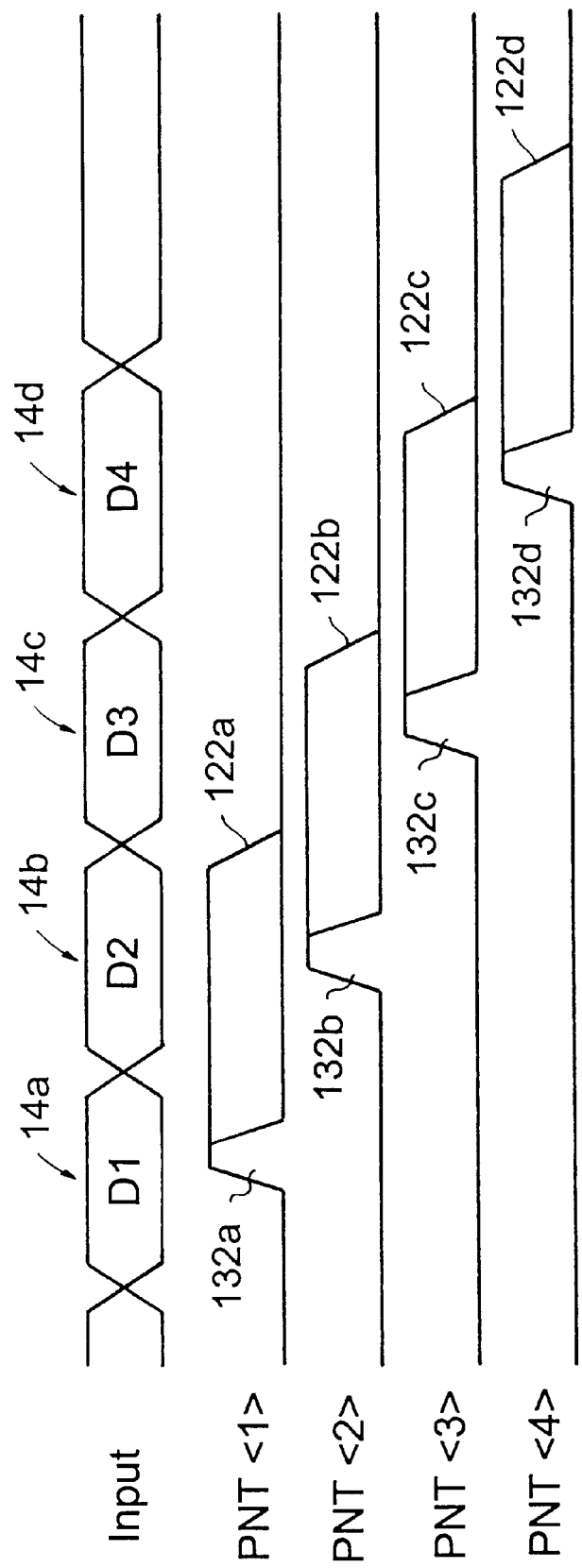
FIG. 3(b) illustrates the timing relationship of respective overlapping global pointer signals and corresponding local generated pointer signals.

The invention is a circuit architecture and methodology for enabling dynamic latching of data transferred in a burst mode in high-speed digital circuit applications. FIG. 3(a) illustrates a dynamic-latch-receiver architecture 100 according to a first embodiment of the invention which includes latch devices 138a, . . . ,138d responsive to a corresponding edge of respective local pointer signals 132a, . . . ,132d (FIG. 3(b)) for latching respective input data signals 14a, . . . ,14d from single input line 14. Particularly, the circuit 100 employs overlapped global pointer signals 122a, . . . ,122d that are self-reset locally to generate the corresponding local pointers. Optionally, the self-reset pointer logic may be shared with two or more latches. As will be described, in further view of FIG. 3(b), each of the local generated pointer signals 132a, . . . ,132d is a pulse signal of small-pulse-width and is generated in a non-overlapping, sequential manner so as to overcome the problem of latching the wrong state of the input. This design thus enables the use of the overlapped global pointer signals 122a, . . . ,122d, eliminating the low pass filter problem due to the wiring RC.

Included as part of each latch circuit 138a, . . . ,138d is a cascade (stack) connection of FET transistor devices, which is now explained in greater detail. Taking latch device 138a for exemplary purposes (FIG. 3(a)), each latch device includes a first PMOS (P FET) device 141a having a first terminal tied to a power supply voltage 145, a gate for receiving a precharge signal 128a, and a third terminal connecting a first terminal of a second NMOS (N-FET) device 142a. The gate terminal of the second N-FET 142a receives the local self-reset pointer signal 132a for triggering the data latch at corresponding latch 138a, and includes a third terminal connected to a first terminal of N-FET device 143a which is a low-threshold voltage device (NMOS) having a gate terminal for receiving the low voltage swing burst data 14. The low voltage swing burst data 14 is fetched to the corresponding latch circuit, e.g., 138a, when the corresponding locally generated pointer, e.g., 132a, goes high. A third terminal of N-FET device 143a is connected to ground. The signals 128a, . . . ,128d precharges each respective latched node, before the corresponding local pointer 132a, . . . ,132d goes high as in a conventional dynamic logic. Note that the precharge levels of each respective node may be the same or different regardless of the input voltage swing 14. For example, although the voltage swing of data input 14 may range from 0V to 1V, the latched results may be 1V, 2V, 3V or 4V for the latched nodes <1:4>, respectively. The variable latched voltage is important if the latched nodes <1:4> are used for different purposes such as data, address, or test mode, while sharing the input bus 14. Each of the remaining latch circuits 138b, . . . ,138d comprises identical circuitry. It should be understood that the receiver device of the first embodiment may be comprised of more than four latches, and may be implemented for applications requiring high-speed latching of 8-, 16-, and even 32-bit signals.

As further shown in FIG. 3(a), each respective local pointer signal 132a, . . . ,132d is generated by a corresponding logic circuit 148a, . . . ,148d each of which comprises a logic gate, for example, NOR gate 158a. Particularly, one input of the NOR gate receives the global pointer signal and a second input receives the global pointer signal delayed in time. In the embodiment shown in FIG. 3(a), each logic circuit employs one or more inverter devices, e.g., connected in series, at each input, which, according to design choices, provides the required time delay, and dictates the corresponding pulse width of the corresponding generated local pointer signal. The self-reset action is accomplished as follows: the edge of the global pointer signal at the first inputs to the NOR gate triggers the rising edge of a corresponding local pointer signal (FIG. 3(b)). The delayed edge of the global pointer signal caused by the series of inverters connected at the second input to the NOR gate causes the reset (falling edge) of the corresponding local pointer signal. As shown, it is imperative that the an odd number of inverters be present in order to provide the local pointer signal self-reset action.

Thus, although each global pointer signal 122a, . . . ,122d is provided overlapped in time at each respective logic circuit input 148a, . . . ,148d, a suitable choice of inverter circuit configuration will enable the corresponding generation of local pointer signals that are non-overlapped in time. It should be understood by skilled artisans that equivalent digital logic may be employed in logic circuits 148a, . . . ,148d for accomplishing the local pointer self-reset action without departing from the scope and spirit of the invention.

Figure 4A:
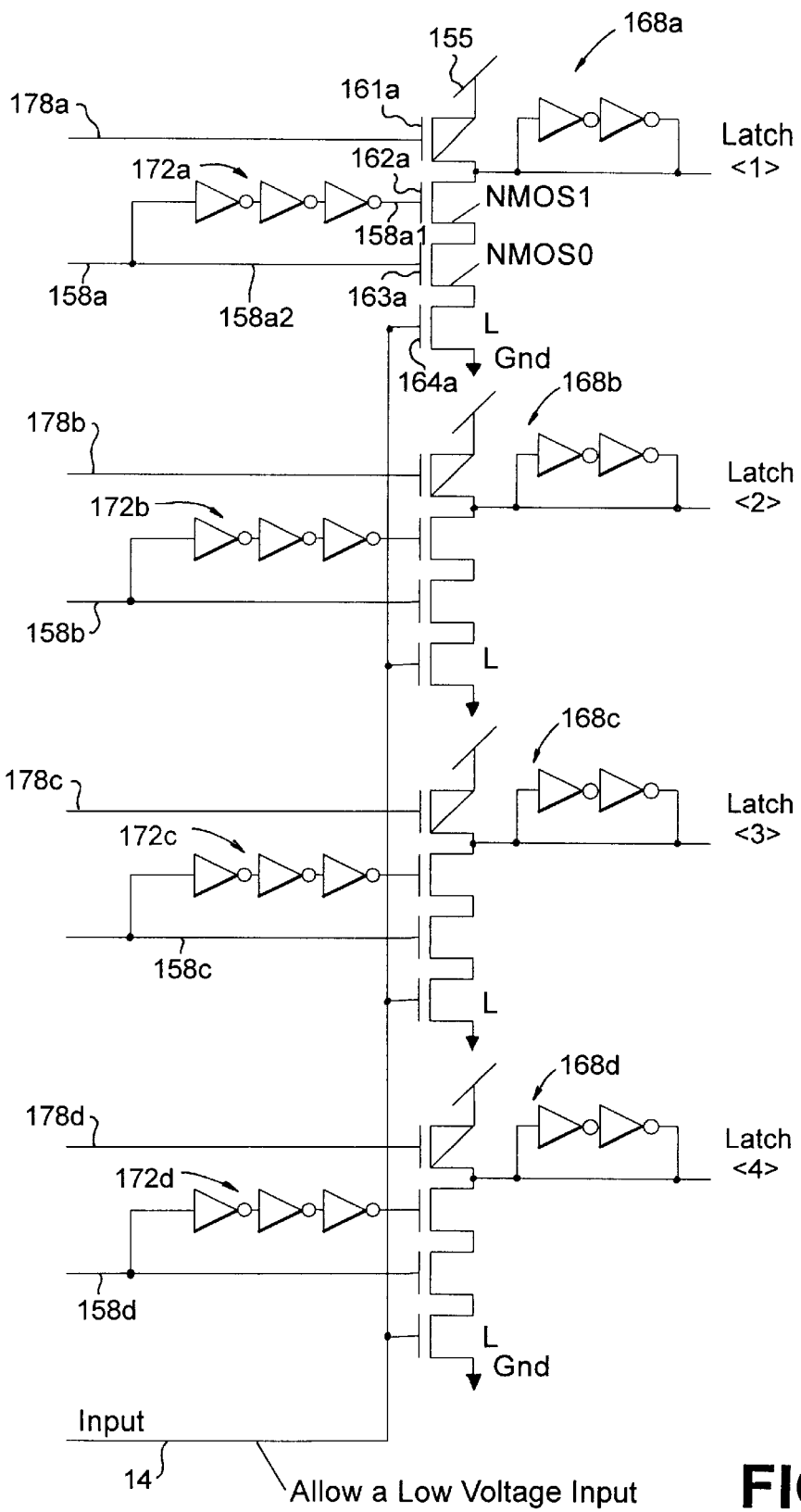
FIG. 4(a) illustrates the dynamic-latch-receiver architecture implementing self-reset locally generated pointer signals according to a second embodiment of the invention.
Figure 4B:
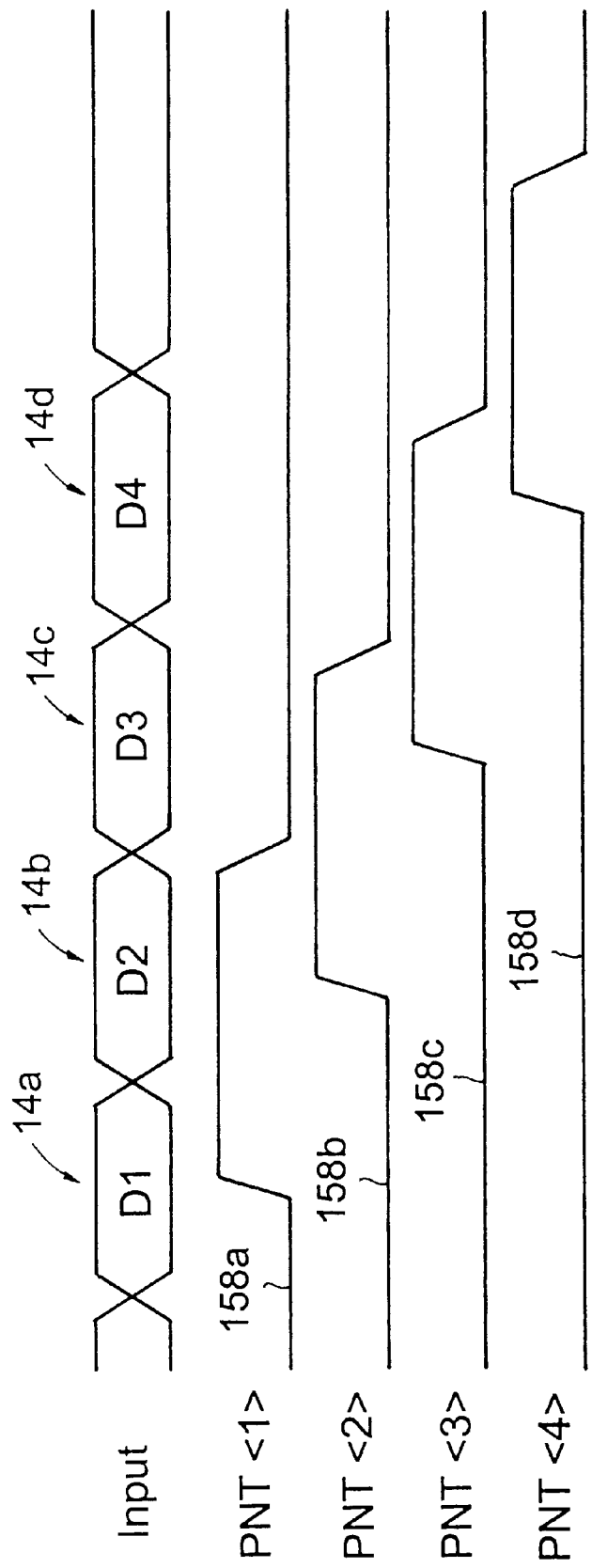
FIG. 4(d) illustrates the timing relationship of respective overlapped global pointer signals used for triggering burst data transfer.

FIG. 4(a) illustrates a dynamic-latch-receiver architecture 200 according to a second embodiment of the invention which includes latch devices 168a, . . . ,168d responsive to a corresponding edge of respective global pointer signals 158a, . . . ,158d (FIG. 4(b)) for latching respective input data signals 14a, . . . ,14d from single input line 14. Particularly, in this second embodiment, each respective latch circuit 168a, . . . ,168d is responsive to global pointer signals directly, without the need for generating corresponding local pointer signals, as will now be explained in further detail. Particularly, included as part of each latch circuit 168a, . . . ,168d is a cascade (stack) connection of FET transistor devices directly responsive to a corresponding global pointer signal 158a, . . . ,158d (FIG. 4(b)). Taking latch device 168a for exemplary purposes (FIG. 4(a)), each latch device includes a first PMOS (P FET) device 161a having a first terminal tied to a power supply voltage 155, a gate for receiving a precharge signal 178a, and a third terminal connecting a first terminal of a second NMOS N-FET) device 162a. As discussed herein, the power supply voltage 155 for each latch <1:4> may be the same or different. The gate terminal of the second N-FET 162a receives a pointer signal 158a1, and includes a third terminal connected to a first terminal of N-FET device 163a having a gate for receiving the global pointer signal 158a2 for triggering the data latch at corresponding latch 168a. Preferably, pointer signals 158a1 and 158a2 are generated by corresponding global pointer signal 158a with pointer signal 158a1 being delayed in time and inverted with respect to a global pointer signal 158a2. A third terminal of N-FET device 163a is connected to a first terminal of a final NMOS (N-FET) device 164a which is a low-threshold voltage device having a gate terminal for receiving the burst data signals 14. The low voltage swing burst data on bus 14 is fetched to the corresponding latch circuit 168a when the corresponding global pointer 158a rises, and is reset when the corresponding locally delayed pointer 158a1 goes low. A third terminal of N-FET device 164a is connected to ground. The signals 178a, . . . ,178d precharges each latched node, before the input data has been transferred to the latch as in a conventional dynamic logic.

With greater specificity, NFET 163a is activated when the pointer signal 158a (158a2) goes high, however, is disabled by the NFET 162a upon receipt of the delayed and inverted pointer signal 158a1 by use of logic inverters 172a. The data input, e.g., 14a, is valid for only the time when both the NFETs 162a, 163a are on, resulting in a similar function as provided by the embodiment shown and described with respect to FIG. 3(a). Each of the remaining latch circuits 168b, . . . , 168d comprises identical circuitry and operate identically. It should be understood that the receiver device of the second embodiment may be comprised of more than four latches, and may be implemented for applications requiring high-speed latching of 8-, 16-, and even 32-bit signals.

As an optional feature, applicable to the dynamic latch receiver of both embodiments, the pointer signal pulse-width may be controlled by a delay monitor (not shown), which measures the time to flip a dummy dynamic-latch (not shown).

This architecture is simple and effective, and advantageous for prefetching data applications in high-frequency VLSI designs and dynamic RAM architectures, e.g., utilizing double-data synchronous DRAM or Rambus DRAM. Thus, for example, the dynamic-latch-receiver circuits 100 and 200 of the invention may accomplish a 4-bit data pre-fetch in 5 nsec (corresponding to a clock speed of 200 MHZ) and may be implemented for pre-fetching data in computer systems implementing dynamic RAM such as shown and described with respect to commonly-owned, copending U.S. patent application Ser. No. 09/275,567, the contents and disclosure of which is incorporated by reference as if fully set forth herein.

Although the invention is discussed for chip design, however, the logic employed herein may be used for system, or even for software controlled applications.

While the invention has been particularly shown and described with respect to illustrative and preformed embodiments thereof, it will be understood by those skilled in the art that the foregoing and other changes in form and detail may be made therein without departing from the spirit and scope of the invention which should be limited only by the scope of the appended claims.

Having thus described our invention, what we claim as new, and desire to secure the Letters Patent is:

1. A dynamic latch receiver device comprising:
   a sequence of data latch devices arranged in parallel for enabling sequential latching of data signals communicated serially on a single data line;
   first pointer signal generator for generating a sequence of one or more first pointer signals, each generated first pointer signal of a sequence corresponding to a specific latch device; and
   pulse converter means associated with a latch device for receiving a corresponding first pointer signal and generating a respective second pointer signal for input to a respective latch device, each said second pointer signal generated in a non-overlapping sequence for triggering a respective latching of each data signal in synchronism with serially communicated data signals.

2. The receiver device as claimed in claim 1, wherein each generated second pointer signal is a pulse signal having a width smaller than a width of its corresponding first pointer signal.

3. The receiver device as claimed in claim 1, wherein each generated second pointer signal of a sequence overlaps in time with a prior generated first pointer signal of said sequence.

4. The receiver device as claimed in claim 1, wherein one or more said latch devices latch data of different voltage levels.

5. The receiver device as claimed in claim 3, wherein said latch device further comprises:
   a first FET transistor device having a gate terminal for receiving a data signal, and a second terminal; and
   a second FET transistor device having a gate terminal for receiving a corresponding second pointer signal in synchronism with receipt of said data signal, and a second terminal connected to said second terminal of said first FET transistor device.

6. The receiver device as claimed in claim 5, wherein said latch device further comprises a third FET transistor device having a gate terminal for receiving a precharge signal prior to latching a respective data signal, and a second terminal connected to a third terminal of said second FET transistor device.

7. The receiver device as claimed in claim 4, wherein said first FET transistor device comprises a low threshold NMOS FET for enabling latching of a data signal having a voltage lower than a latched voltage.

8. The receiver device as claimed in claim 1, wherein said pulse converter means comprises:
   a logic gate having a first input receiving a first pointer signal of a first polarity and outputting said second pointer signal; and
   means simultaneously receiving said first pointer signal and generating a first pointer signal delayed in time and of opposite polarity for input to a second input of said logic gate, said logic gate responsive to said delayed and inverted pointer signal at said second input for resetting said second pointer signal.

9. The receiver device as claimed in claim 8, wherein said logic gate device includes a NOR gate.

10. The receiver device as claimed in claim 8, wherein said means for generating a first pointer signal delayed in time and of opposite polarity further includes one or more serially connected logic inverter devices.

11. The receiver device as claimed in claim 5, wherein a corresponding precharge signal for precharging a respective latch device enables latching of a corresponding data signal at a desired voltage level regardless of the voltage level of the data signal input.

12. A dynamic latch receiver device comprising:
   a sequence of data latch devices arranged in parallel for enabling sequential latching of data signals communicated serially on a single data line;
   pointer signal generator for generating a sequence of one or more pointer signals, each generated pointer signal of a sequence being input to a respective first input of a corresponding specific latch device; and,
   means for simultaneously delaying a respective said pointer signal in time for receipt at a second input of a corresponding latch device, wherein said pointer signal at said first input of a respective latch device triggers a respective latching of a data signal arriving in synchronism therewith on said data line, and said delayed pointer signal at said second input resets said pointer signal.

13. The receiver device as claimed in claim 12, wherein each generated pointer signal of a sequence overlaps in time with a prior generated pointer signal of said sequence.

14. The receiver device as claimed in claim 12, wherein said latch device further comprises:
   a first FET transistor device having a gate terminal for receiving a data signal, and a second terminal;
   a second FET transistor device having a gate terminal for receiving a corresponding pointer signal in synchronism with receipt of said data signal, and a second terminal connected to said second terminal of said first FET transistor device, and a third terminal; and a third FET transistor device having a gate terminal for receiving said delayed pointer signal and a second terminal connected to said third terminal of said second FET transistor device.

15. The receiver device as claimed in claim 14, wherein said latch device further comprises a fourth FET transistor device having a gate terminal for receiving a precharge signal prior to latching a data signal, and a second terminal connected to a third terminal of said third FET transistor device.

16. The receiver device as claimed in claim 14, wherein said second FET transistor and third FET transistor devices comprises an NMOS FET.

17. The receiver device as claimed in claim 14, wherein said first FET transistor device comprises a low threshold NMOS FET for enabling latching of a data signal having a voltage lower than a latched voltage.

18. The receiver device as claimed in claim 12, wherein said means corresponding to a specific latch device for simultaneously receiving a corresponding pointer signal, and delaying said pointer signal in time further includes one or more serially connected logic inverter devices.

19. The receiver device as claimed in claim 14, wherein a corresponding precharge signal for precharging a respective latch device enables latching of a corresponding data signal at a desired voltage level regardless of the voltage level of the data signal input.

20. A method for sequentially latching a sequence of input data signals communicated serially on a single data line comprising:

providing a sequence of data latch devices arranged for sequentially latching said data signals;

generating a sequence of one or more first pointer signals, each generated first pointer signal of a sequence corresponding to a specific latch device; and converting each first pointer signal into a corresponding respective second pointer signal for input to a respective latch device, each said second pointer signal generated in a non-overlapping sequence for triggering a respective latching of each data signal in synchronism with said serially communicated data signals.

21. The method as claimed in claim 20, wherein each generated second pointer signal is a pulse signal having a pulse width smaller than a pulse width of its corresponding first pointer signal.

22. The method as claimed in claim 20, wherein said generating step includes generating overlapped pointer signals, whereby each pointer signal of a sequence overlaps in time with a prior generated pointer signal of said sequence.

23. The method as claimed in claim 21, wherein said converting step comprises:

providing a logic gate having a first input for receiving a corresponding first pointer signal at a first polarity and for outputting said second pointer signal; and simultaneously inverting and delaying said first pointer signal in time for input at a second input of said logic gate, said logic gate responsive to said delayed and inverted first pointer signal at said second input for resetting said second pointer signal.

24. The method as claimed in claim 23, further comprising the step of generating a precharge signal for input at a corresponding latch device prior to latching a respective data signal, said precharge signal enabling latching of a corresponding data signal at a desired voltage level regardless of the voltage level of the data signal input as communicated.

25. A method for latching a sequence of input data signals communicated serially on a single data line comprising:

providing a sequence of data latch devices arranged in parallel for sequential latching of data signals communicated serially on a single data line;

generating a sequence of one or more pointer signals, each generated pointer signal of a sequence being input to a respective first input of a corresponding data latch device for triggering a respective latching of a data signal arriving in synchronism therewith on said data line; and, delaying said pointer signal in time for receipt at a second input of an associated latch device, wherein said delayed pointer signal at said second input resets said generated pointer signal.

* * * * *